United States Patent [19]

Sienski

[11] Patent Number: 5,200,580
[45] Date of Patent: Apr. 6, 1993

[54] CONFIGURABLE MULTI-CHIP MODULE INTERCONNECT

[75] Inventor: Kenneth T. Sienski, Plano, Tex.

[73] Assignee: E-Systems, Inc., Dallas, Tex.

[21] Appl. No.: 749,932

[22] Filed: Aug. 26, 1991

[51] Int. Cl.$^5$ .............................................. H05K 1/00
[52] U.S. Cl. .................... 174/264; 174/255; 361/414; 361/412
[58] Field of Search ............... 361/403, 404, 409, 412, 361/416, 414; 174/35 R, 51, 250, 254, 255, 256, 261, 266; 357/80

[56] References Cited

U.S. PATENT DOCUMENTS

| | | | |
|---|---|---|---|
| 4,362,899 | 12/1982 | Borrill | 361/409 X |
| 4,803,595 | 2/1989 | Kraus et al. | 361/416 X |
| 4,899,439 | 2/1990 | Potter et al. | 174/255 X |
| 4,920,639 | 5/1990 | Yee | 174/261 X |
| 5,072,075 | 12/1991 | Lee et al. | 174/255 X |

OTHER PUBLICATIONS

Jarvela, R. A. and M. J. Jesrani, *Wirability Enhancement*, IBM Disclosure Bulletin, vol. 21, No. 9, Feb. 1979, p. 3624.

*Primary Examiner*—Leo P. Picard
*Assistant Examiner*—Trinidad Korke
*Attorney, Agent, or Firm*—Harold E. Meier

[57] ABSTRACT

A multi-chip module interconnect structure is configurable for a desired application. A power/ground layer and one of two signal interconnect layers have a fixed metal pattern and are generated once for multiple applications. A second signal interconnect layer and a bond pad layer are custom designed for the particular application. The fixed interconnect layer has a repeating pattern of horizontal metal strips in rows and of three different lengths. The end points of each row of strips are staggered to increase routeability by reducing vertical blockage. Power distribution and ground rails are periodically positioned in the repeating pattern to provide current to the power/ground layer. A custom router generates the second signal interconnect layer for the particular application involved.

12 Claims, 3 Drawing Sheets

CONFIGURABLE MULTI-CHIP MODULE INTERCONNECT

TECHNICAL FIELD

This invention relates to a multi-chip module, and more particularly to a configurable multi-chip module interconnect structure for multiple applications.

BACKGROUND OF THE INVENTION

A typical multi-chip module structure consists of four layers of metal to achieve optimum surface density in the module. Insulated from the substrate is the first or power/ground layer. Extending above the power/ground layer are two layers of metal for electrical signal interconnections. A top or bond pad layer for connecting a die to the substrate extends above the two signal interconnect layers. Historically, to accommodate different applications, each of the four layers of the multi-chip module have been custom designed and fabricated to form the completed module.

Because each layer has to be custom designed and fabricated for each different application, the time and costs incident thereto are considerable. New masks have to be designed for fabricating each separate layer and can not be reused from one application to another. Commercially available anti-fuse programmable modules are process dependent and degrade the density and performance characteristics of the technology.

SUMMARY OF THE INVENTION

The configurable multi-chip module (MCM) of the present invention overcomes the foregoing and other problems of existing multi-chip modules by having a fixed signal interconnect layer and a fixed power/ground layer with a second interconnect layer and a bond pad layer being customized for each particular design application. Such fixed configuration of the power/ground and first signal interconnect layers allows the masks to be reused from one application to another, thereby reducing the costs associated with developing different applications.

Nonrecurring manufacturing charges are reduced by the configurable MCM approach where approximately half of the masks are fixed and need only be generated once for multiple designs. Additionally, recurring manufacturing charges are reduced by prefabricating volume lots of the fixed layers and storing these layers until needed for assembly with customized second interconnect and bond layers to form the completed module. Maintaining an inventory of prefabricated fixed layers results in a shorter development cycle where a given design is partially built before release to manufacturing for customizing the remaining two layers. In addition, an automatic router is used to generate the custom interconnect layer, thereby reducing the time and expense of building the MCM.

BRIEF DESCRIPTION OF THE DRAW

For a more complete understanding of the present invention and the advantages thereof, reference is now made to the following Detailed Description taken in conjunction with the accompanying Drawings in which.

DETAILED DESCRIPTION

Figure 1:
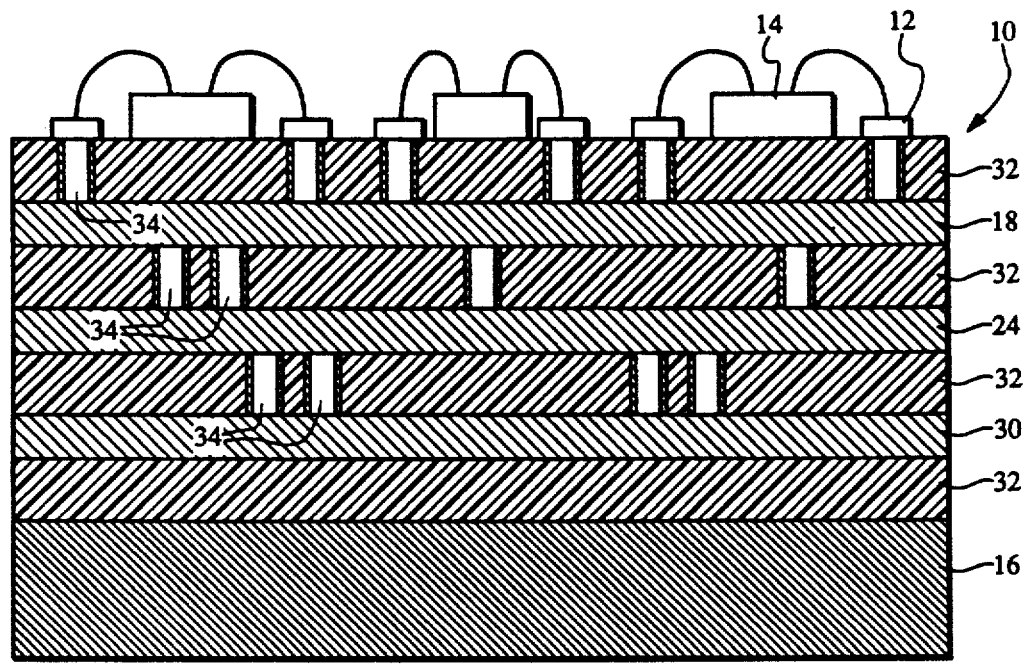
FIG. 1 is a cross-section view of a multi-chip module of the present invention.
Figure 4:
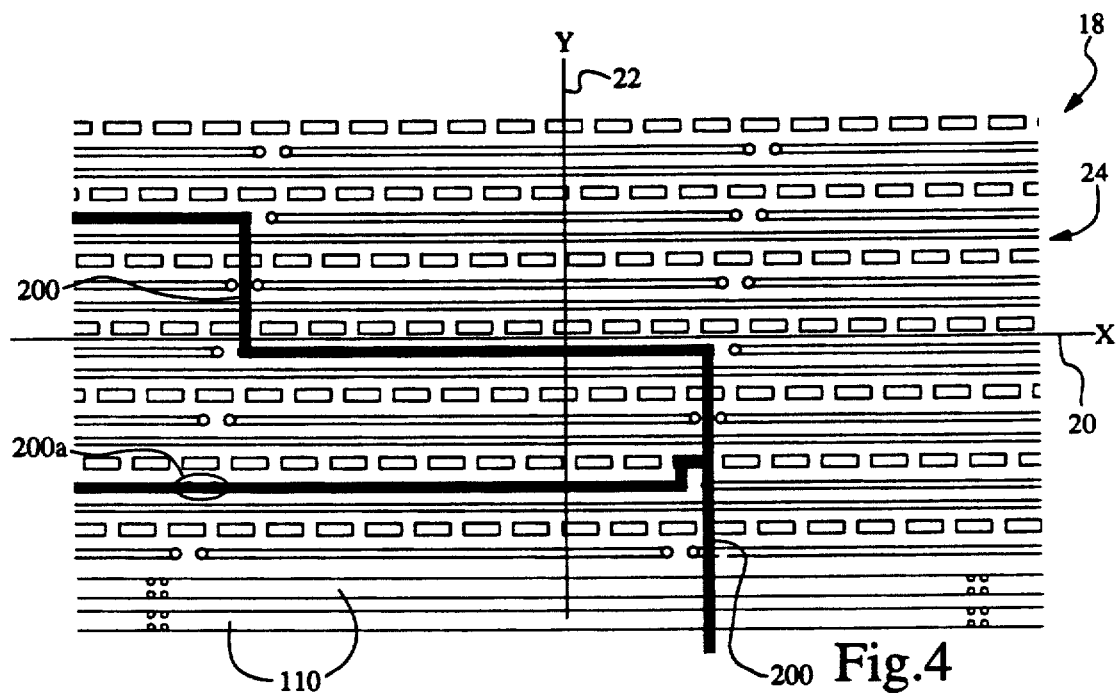
FIG. 4 is a top view of portions of the first signal interconnect layer and a second signal interconnect layer of the module of FIG. 1.

As shown by the configurable multi-chip module (MCM) 10 of FIG. 1, typically four levels of metal are required to achieve optimum surface density in an MCM. The top metal layer or bond pad layer 12 provides electrical connection between a die 14 and underlying metal layers. Below the bond pad layer 12 is a first signal interconnect or Y-interconnect layer 18 (thickness is exaggerated for purposes of this description) having X and Y axes 20 and 22 as shown in FIG. 4. The Y-interconnect layer 18 is a "configurable" metal layer of the MCM 10. Electrical signals are routed over the Y-interconnect layer in a direction substantially parallel to the Y-axis.

Figure 2:
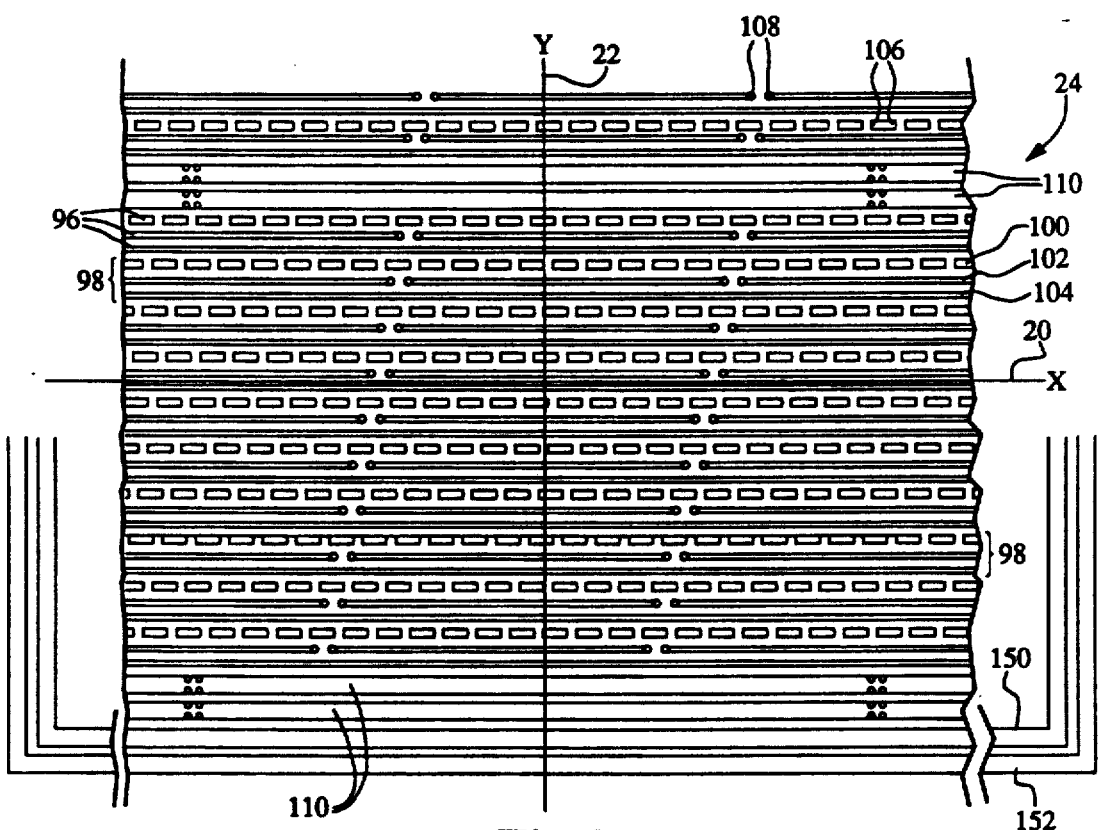
FIG. 2 is a partial top view of a first signal interconnect layer of the module of FIG. 1.

A second interconnect or X-interconnect layer 24 (thickness is exaggerated for purposes of this description) is positioned below the Y-interconnect layer 18 and has X and Y axes 20 and 22, as shown in FIG. 2. The X-interconnect layer 24 is one of the "fixed" metal layers of the MCM 10. Signals are routed over the X-interconnect layer in a direction substantially parallel to the X-axis. A power/ground layer 30 is positioned below the X-interconnect layer 24 for distributing power across the module 10. The power/ground layer 30 (thickness is exaggerated for purposes of this description) is a second "fixed" metal layer of the MCM 10. A substrate 16 is positioned below the power/ground layer.

Each of the metal layers is separated one from the other by a layer 32 of dielectric material (thickness is exaggerated for purposes of this description). Vias 34 extend through the dielectric layers 32 to connect the metal layers.

Unlike existing MCM's, the configurable MCM 10 has a fixed power/ground layer 30 and X-interconnect layer 24. The fixed power/ground layer 30 has wide metal traces interlaced across the module 10. The placement of the wide metal traces of the power/ground layer 30 are configured in a pattern for use in a number of applications.

As shown in FIG. 2, the X-interconnect layer 24 (only a small section is shown in FIG. 2) has a fixed pattern of metal strips 96 of three different lengths grouped into a pattern 98 of three rows 100, 102, and 104 spanning the width of the module 10. The row 100 of the metal strips 96 is made up of short segments of metal strips approximately 6 mils in length placed end to end and extending substantially parallel to the X-axis 20. The row 102 is made up of medium segments of metal strips approximately 60 mils in length and extending end to end in a row substantially parallel to the row 100 and the X-axis 20. Long segments of metal strips approximately 600 mils in length make up the row 104 extending parallel to the first and second rows 100 and 102 and the X-axis 20.

The pattern 98 of three rows 100, 102 and 104 is repeated across the module 10 at a pitch as determined by the manufacturing process. In accordance with a feature of the present invention, end points 106 of the metal segments of row 100, end points 108 of the metal segments of row 102, and end points of the segments of row 104 are positioned in staggered arrangement to increase signal routeability by reducing blockages in a direction extending parallel to the Y-axis 22.

Figure 3:
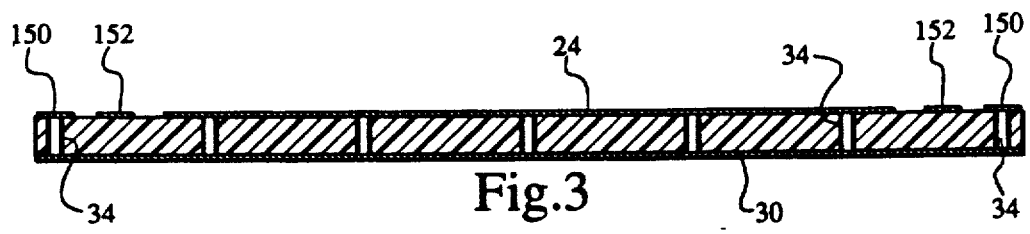
FIG. 3 is a cross-section view of a portion of the module of FIG. 1 showing portions of the first signal interconnect layer, the bond pad layer, and connecting vias.

Located between every tenth repeat of the pattern 98 of three rows 100, 102, and 104 are power and ground rails 110. The power and ground rails 110 extend parallel to the rows of metal strips 96 and are connected by vias 34 to the wide metal traces of the power/ground layer 30 to evenly distribute power across the module 10. As shown in FIGS. 2 and 3, the X-interconnect layer 24 is encircled by a metal power ring 150 and a ground ring 152 extending around the entire perimeter of the X-interconnect layer 24.

Referring now to FIG. 4, there is shown a small section of the Y-interconnect layer 18 overlaying the X-interconnect layer 24 with the dielectric layer 32 removed for purposes of this description. Metal strips 200 of the Y-interconnect layer 18 are configured to selectively interconnect metal strips 96 on the fixed pattern 98 of the X-interconnect layer 24 to configure the MCM 10 to a particular application. The metal strips 200 of the Y-interconnect layer 18 extend primarily parallel to the Y-axis 22. An exception, however, is that a metal strip 200a of the Y-interconnect layer 18 extends parallel to the X-axis 20 for jumper connection of metal strip segments extending end to end on the X-interconnect layer 24. The metal strips 200 of the Y-interconnect layer 18 are also used to access the power and ground rails 110 on the X-interconnect layer. Vias 34 (see FIG. 1) connect the metal strips 200 of the Y-interconnect layer 18 with the metal strips 96 and power and ground rails 110 of the X-interconnect layer 24.

Figure 5:
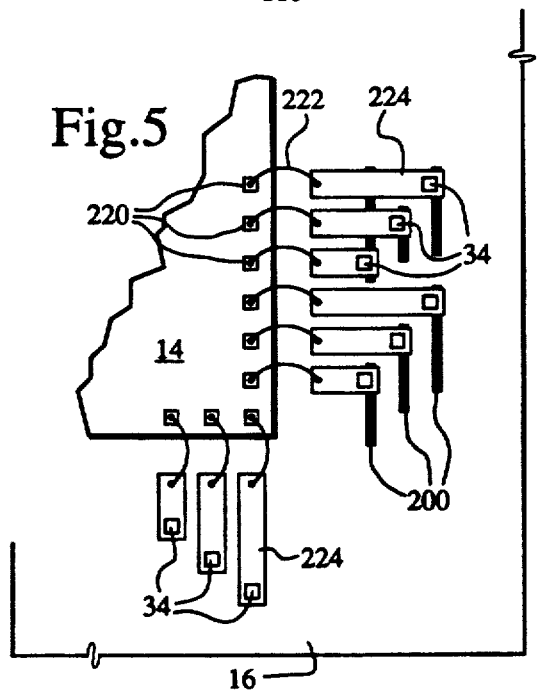
FIG. 5 is a top view of a portion of a bond pad layer of the module of FIG. 1.

Referring now to FIG. 5, there is shown a typical template for the bond pad layer 12 which includes bond pads 220 for input and output connections between a "chip" and the underlying Y-interconnect layer 18 and for connecting the power/ground rails 110 to the MCM package pins. Wires 222 connect the bond pads 220 to bond pads 224, for connections between the die 14 and the underlying Y-interconnect layer 18. The bond pads 224 are connected to the metal strips 200 of the underlying Y-interconnect layer 18 through vias 34. The die 14 is manually placed and a template is created for each chip in the particular application to determine the placement of the bond pads 220 and bond pads 224 to form the bond pad layer 12.

All of the fixed metal layers of the configurable MCM 10 are generated through the use of software wherein dimensions such as metal pitch and via size have been assigned variables to accommodate design rules of different manufacturing processes. Parameters including power level metal width, power vias sizes, X-interconnect staggering, and substrate size, that influence the structure of the fixed layers are modifiable in the software. The program illustrated by block 264 of FIG. 7 outputs a Caltech Intermediate Form (CIF) file, indicated by arrow 262, containing polygon descriptions of all the fixed layers. This information is then utilized by an automatic custom router at 260 to generate the Y-interconnect layer 18.

Figure 6:
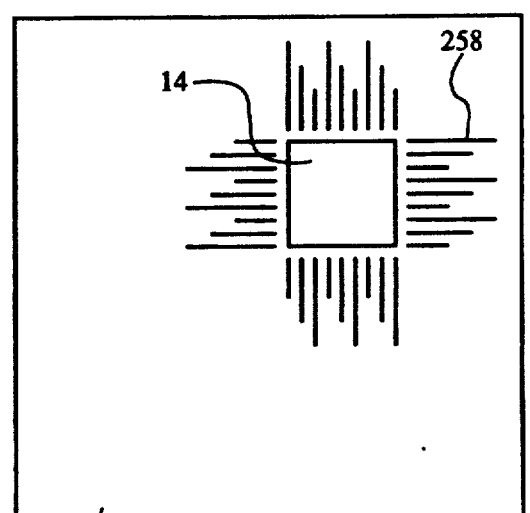
FIG. 6 is a top view of the module of FIG. 1 illustrating the placement of a die template.
Figure 7:
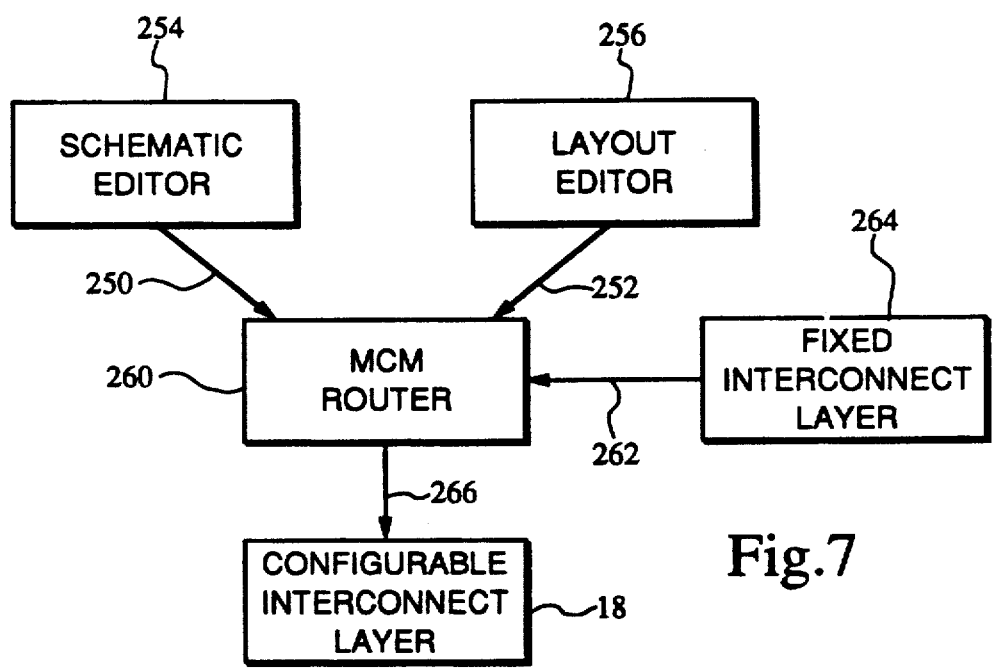
FIG. 7 is a flow diagram of the process by which an automatic router is used to generate the second signal interconnect layer of the module of FIG. 1.

Referring now to FIG. 7, the entry point of information to the automatic MCM router 260 is an electronic design interchange format (EDIF) netlist indicated by arrow 250 from a schematic editor routine 254 and a CIF format placement file indicated by arrow 252 from a layout editor routine 256. The EDIF netlist can be generated with any schematic editor routine 254. Likewise, the CIF placement file 252 can be generated with any integrated circuit layout editor routine 256. The CIF format placement file 252 is created by positioning die templates 258, as shown in FIG. 6, using the integrated circuit layout editor routine 256.

The CIF file 262 containing the polygon descriptions of all the fixed layers is then utilized by the MCM router 260 to dynamically construct an internal interconnect structure. Because the fixed metal layers, i.e., the power/ground layer 30 and the X-interconnect layer 24, are automatically generated for different processes and different sized substrates, the router is not targeted to any one fixed implementation. Therefore, the router 260 is allowed to remain entirely general in dynamically constructing the Y-interconnect layer 18.

Fixed X-interconnect layer 24 information contained in the CIF file 264 is used by the router 260 to build a network of vias in the module 10. The router 260 also uses the information contained in the CIF file 262 to generate arcs representing interconnect segments on the X-interconnect layer 24. Arcs representing possible Y-axis segments are generated dynamically by determining interconnect combinations between vias connecting the X-interconnect 24 layer and Y-interconnect layer 18. Arcs are then generated for jumper connections between end to end adjacent X-interconnect layer 24 metal strips 96. Each arc is assigned a weight commensurate with the length of the trace. A branch-and-bound algorithm is then used to find the shortest path from source to destination throughout the interconnect network.

Signals are routed in sequence as they appear in the netlist from the routine 254. Each signal is routed as a point-to-point connection between two vias. Branching occurs when a signal has multiple destinations. The router 260 selects a branch point by locating the via along the existing path that is physically closest to the new destination. The branch-and-bound algorithm then threats these two points as a new source and destination. As signals are routed, the network is updated by increasing the weight assigned to arcs that have been used.

The router 260 outputs a CIF file indicated by arrow 266 describing the Y-interconnect layer 18 that has been created. The Y-interconnect layer 18 is then merged with the manually generated bond pad layer 12, the X-interconnect layer 24, and the power ground layer 30 to produce the full module 10. A design rule checking program is then run to verify the integrity of the full layout.

Although preferred embodiments of the invention have been illustrated in the accompanying drawings and described in the foregoing Detailed Description, it will be understood that the invention is not limited to the embodiments disclosed, but is capable of numerous rearrangements and modifications of parts and elements without departing from the spirit of the invention.

I claim:

1. A configurable multi-chip module comprising:
   a power/ground layer having a standardized pattern or metal strips;
   a first signal interconnect layer, above said power/ground layer, having a standardized pattern of metal strips extending above said power/ground layer;
   a second signal interconnect layer, above said first signal interconnect layer, configurable to a custom application by placement of metal strips for connection with the standard pattern of metal strips of said first signal interconnect layer;
   a bond pad layer, above said second signal interconnect layer, for receiving chips and connecting input and output leads of the chips to said second signal interconnect layer and dielectric material separating each layer of said module; and
   dielectric material separating each layer of said module.

2. The configurable multi-chip module of claim 1, further comprising a plurality of electrically conductive vias extending through said dielectric material for connecting the metal strips of said power/ground, first and second signal interconnect, and bond pad layers of said module.

3. The configurable multi-chip module of claim 1 wherein the standardized pattern of metal strips of the first signal interconnect layer further comprises a repeating pattern of three rows of metal strips of varying lengths with the endpoints of the strips staggered, said pattern extending down the layer perpendicularly to the direction of the rows.

4. The configurable multi-chip module of claim 3, further comprising spaced apart power and ground rails extending across said first signal interconnect layer and connected through electrically conductive vias to said power/ground layer.

5. The configurable multi-chip module of claim 4 wherein the spaced apart power and ground rails extend parallel to the standardized patter of metal strips at predetermined intervals.

6. The configurable multi-chip module of claim 5 wherein the standardized pattern of metal strips of said power/ground layer comprises metal traces interlaced across a substrate and connected through electrically conductive vias to the power nd ground rails on said first signal interconnect layer.

7. The configurable multi-chip module of claim 1, further comprising a power ring and a ground ring extending around the perimeter of said first signal interconnect layer and connected by electrically conductive vias to the underlying power/ground layer for providing power and a ground plane to the first signal interconnect layer.

8. A configurable multi-chip module interconnect comprising:
   a power/ground layer having a standardized patter of interlaced metal traces;
   a first signal interconnect layer having x and y axes and a standardized pattern of metal strips of varying lengths extending in rows parallel to the x-axis;
   spaced apart power and ground rails on said first signal interconnect layer extending parallel to the x-axis and the parallel rows of metal strips of said first signal interconnect layer, the spaced apart power and ground rails connected through electrically conductive vias to the metal traces of said power/ground layer;
   a second signal interconnect layer having metal strips applied in programmable configuration for connection through electrically conductive vias with the metal strips of the first signal interconnect layer;
   a bond pad layer for connecting input and output leads through electrically conductive vias to said second signal interconnect layer; and
   a dielectric material separating each of said layers of said module.

9. The configurable multi-chip module interconnect of claim 8 wherein the standardized pattern of metal strips of the first signal interconnect layer further comprises a pattern of three rows of metal strips where the strips of the first row have a first length, the strips of the second row have a second length longer that the first row, the strips of the third row have a third length longer that the second row, and the endpoints of the strips are staggered for routeability.

10. The configurable multi-chip module interconnect of claim 8 wherein the spaced apart power rails extend parallel to the standardized pattern of rows of metal strips at predetermined intervals across said first signal interconnect layer and a re connected through electrically conductive vias to the metal strips of said power/ground layer.

11. The configurable multi-chip module interconnect of claim 8, further comprising a power ring and a ground ring extending around the perimeter of said first signal interconnect layer for distribution of current through electrically conductive vias to said underlying power/ground layer.

12. A configurable multi-chip module interconnect comprising:
   a power/ground layer having a standardized patter on of interlaced metal traces;
   a first signal interconnect layer having x and y axes and a standardized pattern of parallel rows of metal strips of varying lengths having staggered end points and extending parallel to the x-axis;
   spaced apart power and ground rails on said first signal interconnect layer extending parallel to the parallel rows of metal strips of said first signal interconnect layer, the spaced apart power and ground rails connected through electrically conductive vias to the metal traces of said power/ground layer;
   a second signal interconnect layer having x and y axes and having metal strips applied in a programmable configuration along the x and y axes for connection through electrically conductive vias with the standardized pattern of metal strips of the first signal interconnect layer;
   a bond pad layer for connecting input and output leads through electrically conductive vias to said second signal interconnect layer;
   dielectric material separating each layer of said module;
   a power ring extending around the perimeter of said first signal interconnect layer for providing power to said first signal interconnect layer; and
   a ground ring extending around the perimeter of said first signal interconnect layer and just inside said power ring for providing a ground plane to said first signal interconnect layer.

* * * * *

UNITED STATES PATENT AND TRADEMARK OFFICE
CERTIFICATE OF CORRECTION

PATENT NO. : 5,200,580
DATED : April 6, 1993
INVENTOR(S) : Kenneth T. Sienski

It is certified that error appears in the above-identified patent and that said Letters Patent is hereby corrected as shown below:

Col. 1, line 60, change "DRAW" to --DRAWINGS--;
Col. 5, line 3, change "or" to --of--;
Col. 5, line 41, change "patter" to --pattern--;
Col. 5, line 47, change "nd" to --and--;
Col. 5, line 58, change "patter" to --pattern--;
Col. 6, line 25, change "a re" to --are--;
Col. 6, lines 36-37, change "patter on" to --pattern--.

Signed and Sealed this

Twenty-second Day of November, 1994

Attest:

*Attesting Officer*

BRUCE LEHMAN
*Commissioner of Patents and Trademarks*